(12) United States Patent
Forbes et al.

(10) Patent No.: US 7,202,739 B2
(45) Date of Patent: Apr. 10, 2007

(54) CMOS AMPLIFIERS WITH FREQUENCY COMPENSATING CAPACITORS

(75) Inventors: Leonard Forbes, Corvallis, OR (US); David R. Cuthbert, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/493,966

(22) Filed: Jul. 27, 2006

(65) Prior Publication Data
US 2006/0261896 A1    Nov. 23, 2006

Related U.S. Application Data

(62) Division of application No. 10/931,796, filed on Sep. 1, 2004.

(51) Int. Cl.
*H03F 3/45* (2006.01)

(52) U.S. Cl. ..................... 330/253; 330/292

(58) Field of Classification Search ............. 330/253, 330/257, 260, 291, 292
See application file for complete search history.

(56) References Cited

U.S. PATENT DOCUMENTS

| 4,721,921 | A | 1/1988 | Vyne et al. |
| 6,275,433 | B1 | 8/2001 | Forbes |
| 6,519,197 | B2 | 2/2003 | Forbes |
| 6,566,961 | B2 * | 5/2003 | Dasgupta et al. ........... 330/301 |
| 6,625,074 | B2 | 9/2003 | Forbes |
| 6,703,898 | B2 * | 3/2004 | Renous ..................... 330/253 |
| 6,731,163 | B2 | 5/2004 | Huckins et al. |
| 6,741,121 | B2 | 5/2004 | Huber |
| 6,788,037 | B2 | 9/2004 | Chevallier et al. |
| 6,931,086 | B2 | 8/2005 | Harrison |
| 6,952,462 | B2 | 10/2005 | Harrison |
| 2003/0016298 | A1 | 1/2003 | Rossi |
| 2004/0222351 | A1 | 11/2004 | Rossi |
| 2006/0044066 | A1 | 3/2006 | Forbes et al. |

OTHER PUBLICATIONS

Amourah, Mayzad M., et al., "A High Gain Strategy with Positive-Feedback Gain Enhancement Technique", *Proceedings of the 2001 IEEE International Symposium on Circuits and Systems*, Sydney, Australia,(May 2001),631-634.

Amourah, Mezyad M., et al., "All Digital Transistors High Gain Operational Amplifier Using Positive Feedback Technique", *IEEE International Symposium on Circuits and Systems*, Phoenix,(May 2002),4 pages.

(Continued)

*Primary Examiner*—Henry Choe
(74) *Attorney, Agent, or Firm*—Schwegman, Lundberg, Woessner & Kluth, P.A.

(57) ABSTRACT

The frequency and transient responses of a CMOS differential amplifier are improved by employing one or more compensating capacitors. A compensating capacitor coupled to a differential input of the CMOS differential amplifier is used to inject current into the differential input, such that the net current flow through the gate-to-drain capacitance of a MOS input transistor approaches zero. Thus, the Miller effect with respect to that MOS input transistor is substantially reduced or eliminated, resulting in increased frequency and transient responses for the CMOS differential amplifier. In one embodiment, the CMOS differential amplifier is a CMOS current mirror differential amplifier.

7 Claims, 11 Drawing Sheets

OTHER PUBLICATIONS

He, Chengming, et al., "A Low-Voltage Compatible Two-Stage Amplifier with greater than or equal to 120dB Gain in Standard Digital CMOS", *Proceedings of the 2003 International Sysmposium on Circuits and Systems*, vol. 1, Bangkok, Thailand, May 25-28, 2003,353-356.

Ramos, Joao, et al., "Three Stage Amplifier With Positive Feedback Compensation Scheme", *IEEE 2002 Custom Integrated Circuits Conference*, (2002),333-336.

Schlarmann, M. E., et al., "Positive Feedback Gain-Enhancement Techniques for Amplifier Design", *IEEE International Symposium on Circuits and Systems*, Phoenix,(May 2002),4 pages.

Yan, Jie, et al., "Open Loop Pole Location Bounds for Partial Positive Feedback Gain Enhancement Operational Amplifiers", *Proceedings of the 2001 Midwest Symposium on Circuits and Systems*, (2001),425-428.

* cited by examiner

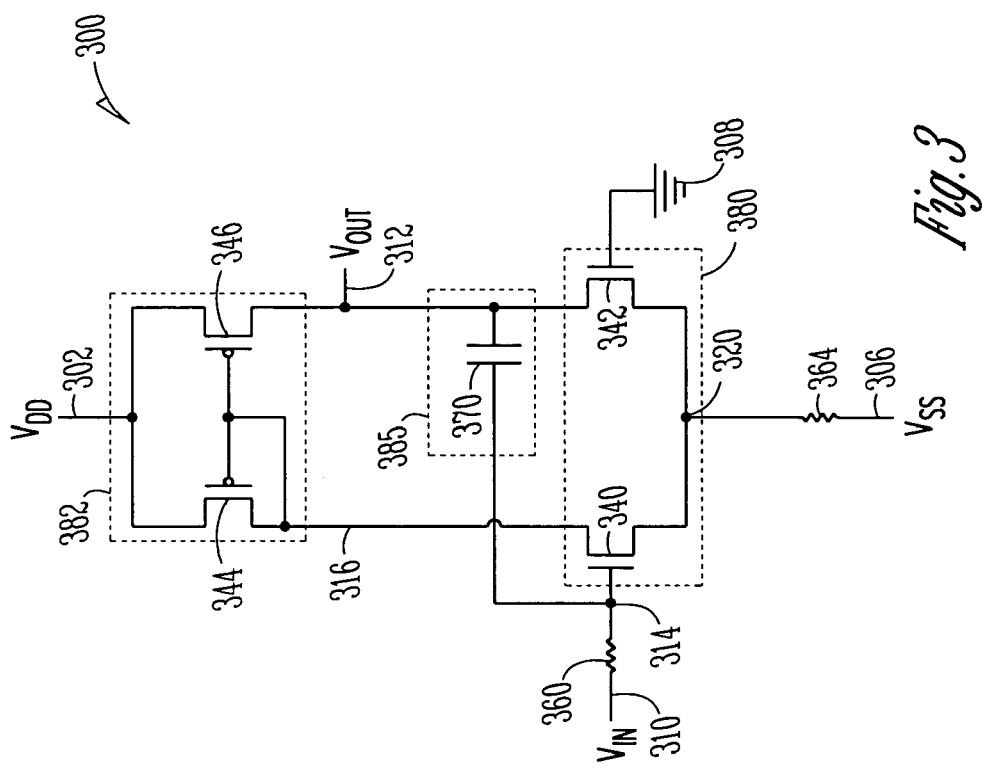
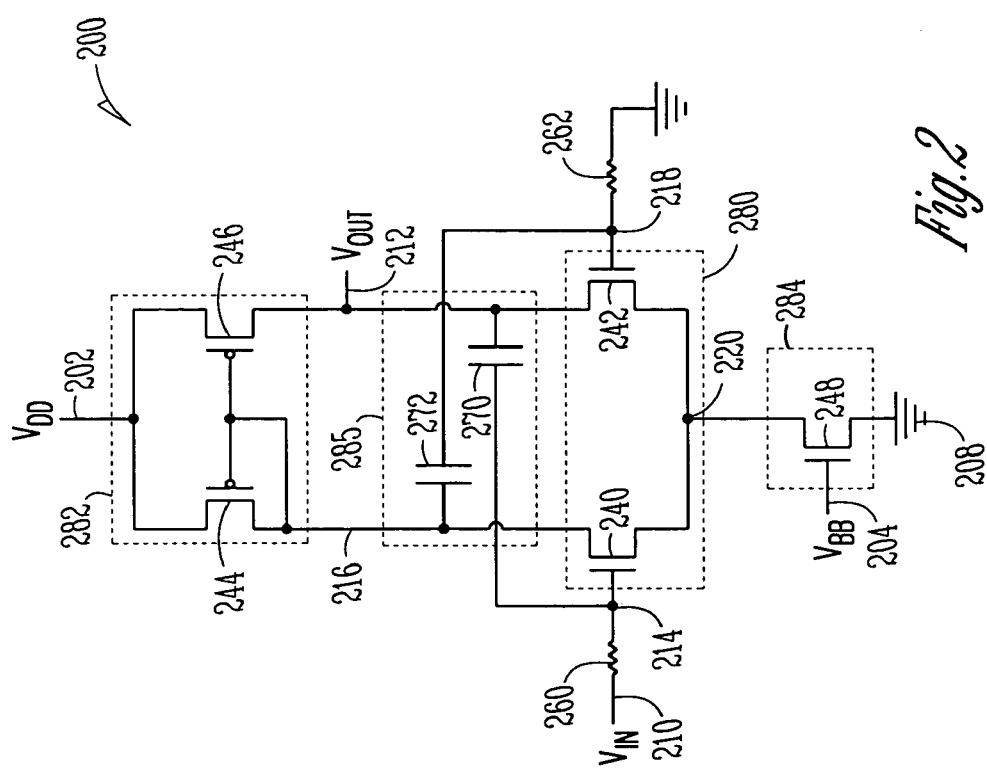

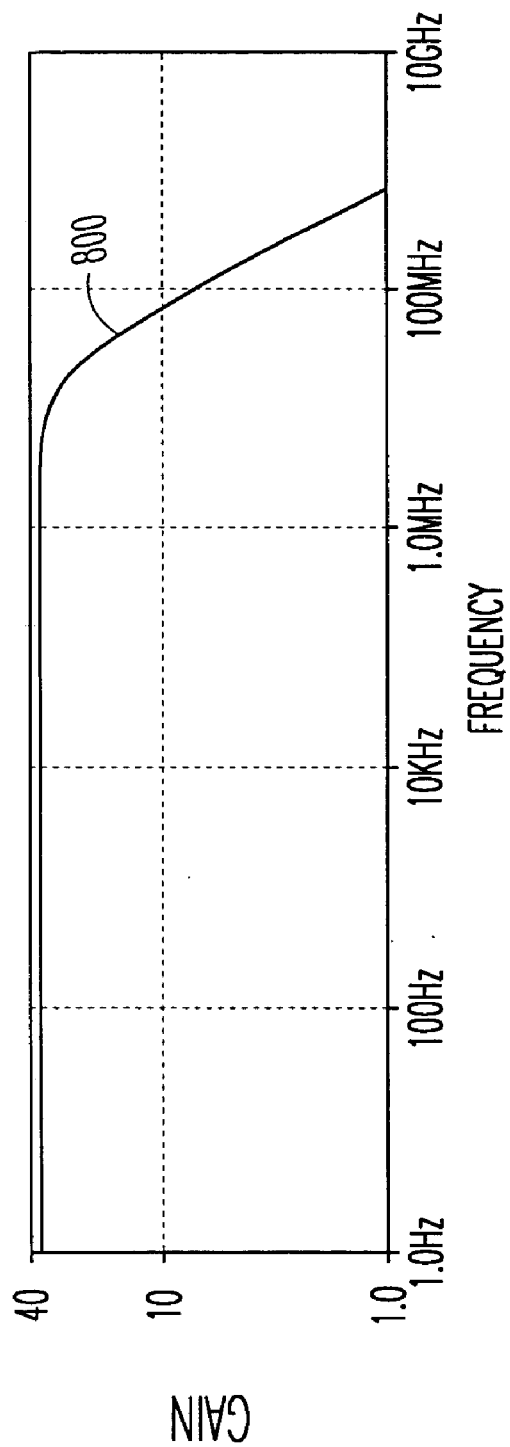
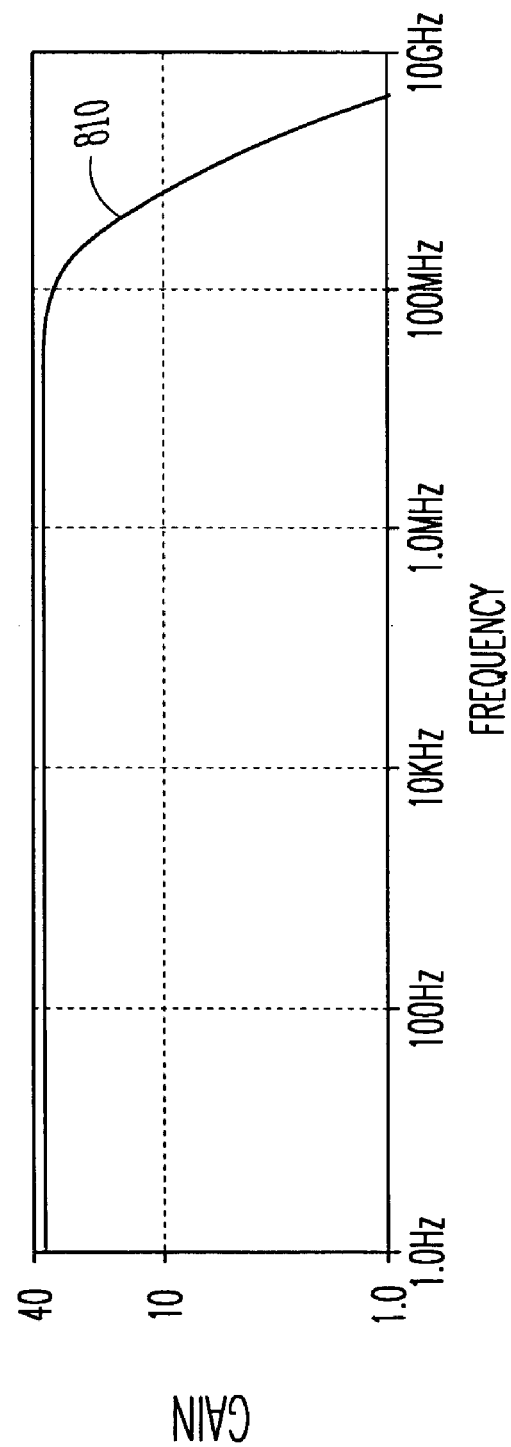
Fig. 8

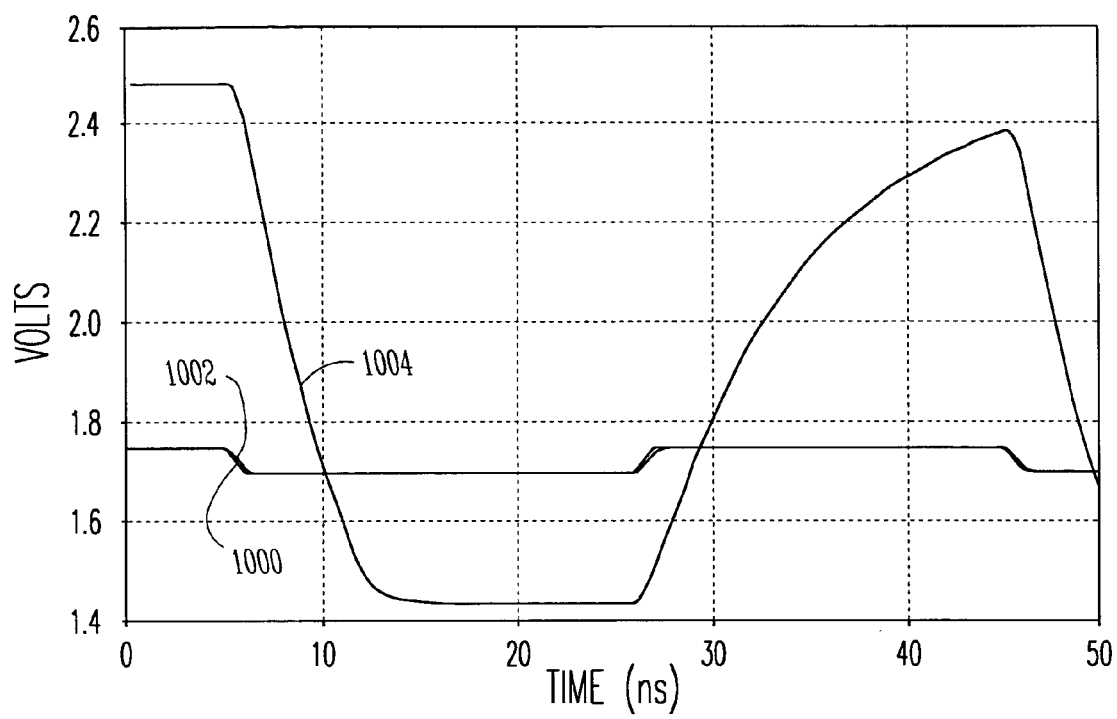
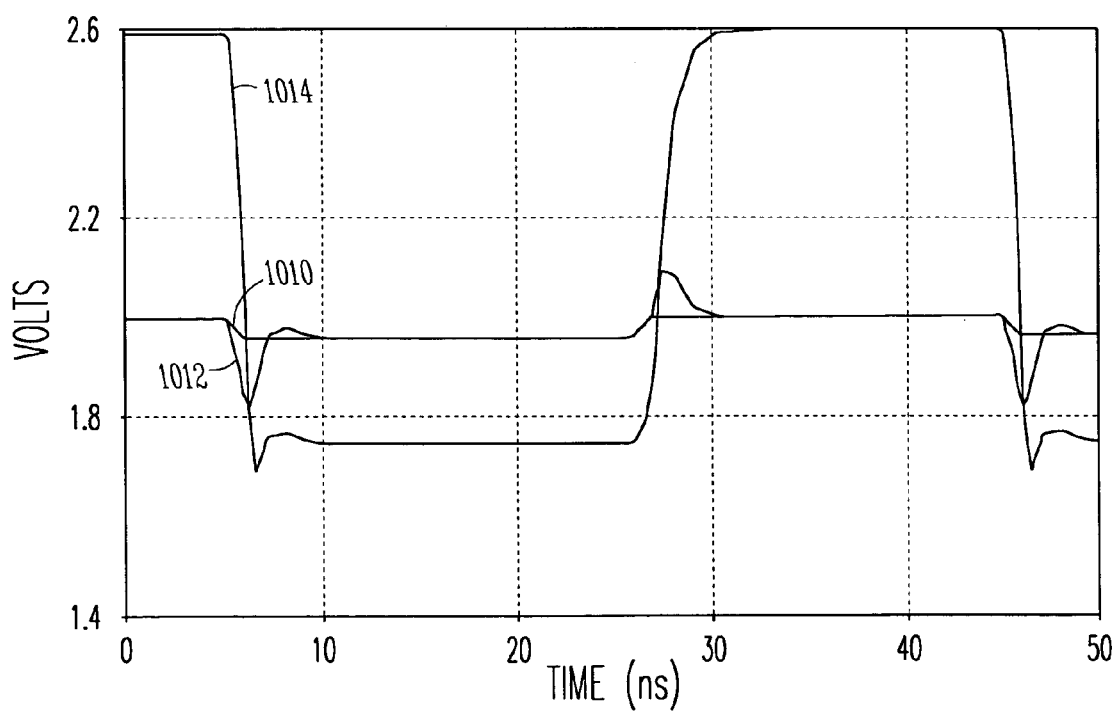
Fig. 10

CMOS AMPLIFIERS WITH FREQUENCY COMPENSATING CAPACITORS

CROSS REFERENCE TO RELATED APPLICATIONS

This application is a divisional application of U.S. patent application Ser. No. 10/931,796, filed Sep. 1, 2004, which is incorporated herein by reference.

TECHNICAL FIELD

This document generally relates to complementary metal-oxide semiconductor (CMOS) amplifiers and particularly, but not by way of limitation, to CMOS differential amplifiers using compensating capacitors to improve frequency and time responses.

BACKGROUND

CMOS differential amplifiers are used in analog and digital circuits. A configuration of a CMOS operational amplifier includes a CMOS differential amplifier followed by an output stage. A CMOS differential amplifier without the output stage is usable, for example, in memory sense amplifiers. One example of a CMOS differential amplifier is a CMOS current mirror differential amplifier that includes a differential input circuit coupled to a current mirror load circuit.

The frequency and time responses of a CMOS amplifier are affected by the Miller effect. The gate-to-drain capacitance of an input transistor is amplified, by the voltage gain of the CMOS amplifier stage that the transistor is a part of, and is reflected back to the transistor input, i.e., the gate terminal of the input transistor. The frequency and time responses are determined by the amplified gate-to-drain capacitance, in addition to the gate-to-source capacitance, of the input transistor. The result significantly reduces frequency response and switching speed of the CMOS amplifier.

There is a need to improve the frequency and time responses of CMOS amplifiers.

BRIEF DESCRIPTION OF THE DRAWINGS

In the drawings, which are not necessarily drawn to scale, like numerals describe similar components throughout the several views. The drawings illustrate generally, by way of example, but not by way of limitation, various embodiments discussed in the present document.

FIG. 2 is a schematic illustrating an embodiment of a CMOS current mirror differential amplifier with a frequency compensation circuit.

FIG. 3 is a schematic illustrating an embodiment of another CMOS current mirror differential amplifier with a frequency compensation circuit.

FIG. 8 includes graphs showing simulation results illustrating the effects of a frequency compensation circuit on the frequency response of the CMOS current mirror differential amplifier circuit of FIG. 2.

FIG. 10 includes graphs showing simulation results illustrating the effects of the frequency compensation circuit on the transient response of the CMOS current mirror differential amplifier circuit of FIG. 2.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description provides examples, and the scope of the present invention is defined by the appended claims and their equivalents.

It should be noted that references to "an", "one", or "various" embodiments in this disclosure are not necessarily to the same embodiment, and such references contemplate more than one embodiment.

This document discusses, among other things, CMOS differential amplifiers using positive feedback frequency compensation technique to improve frequency and transient responses. One or more capacitors provide the positive feedback to compensate for the Miller effect in such a CMOS differential amplifier. In this document, a "MOS transistor" refers to a metal-oxide semiconductor field-effect transistor (or MOSFET), an "NMOS transistor" refers to an n-channel metal-oxide semiconductor field-effect transistor (or n-channel MOSFET), and a "PMOS" refers to a p-channel metal-oxide semiconductor field-effect transistor (or p-channel MOSFET). Each MOS transistor (either NMOS or PMOS transistor) has a gate terminal, a drain terminal, and a source terminal.

The CMOS differential amplifiers illustrated in this document use NMOS input transistors and PMOS load transistors. One of ordinary skill in the art will understand, upon reading and comprehending this disclosure, that the frequency compensation techniques provided herein are equally applicable to inverted amplifier, i.e., CMOS differential amplifiers using PMOS input transistors and NMOS load transistors.

Figure 1A:
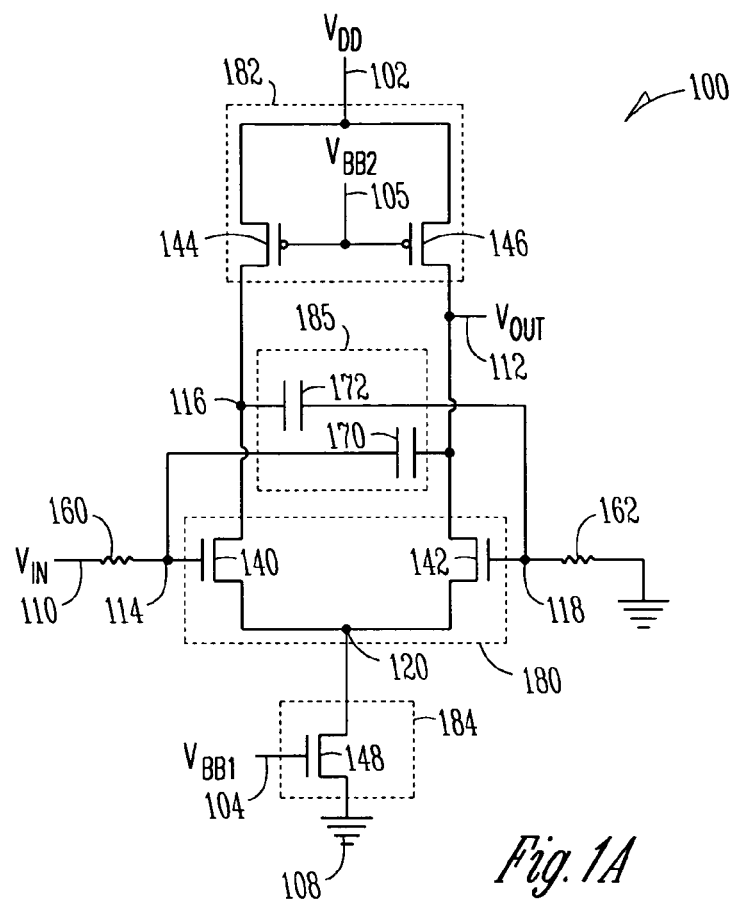
FIG. 1A is a schematic illustrating an embodiment of a CMOS fully differential amplifier with a frequency compensation circuit.

FIG. 1A is a schematic illustrating a CMOS fully differential amplifier 100. Amplifier 100 includes an NMOS differential input circuit 180, a PMOS load circuit 182, a current source circuit 184, and a frequency compensation circuit 185.

NMOS differential input circuit 180 includes approximately matched NMOS input transistors 140 and 142 coupled as a differential pair. The gate terminal of NMOS transistor 140 is coupled to a differential input node 114. The gate terminal of transistor 142 is coupled to another differential input node 118. The source terminals of transistors 140 and 142 are coupled to a source node 120. PMOS load circuit 182 is coupled to the drain terminals of transistors 140 and 142. An input resistor 160 is coupled between a signal input 110 ($V_{IN}$) and differential input node 114. Another input resistor 162 is coupled between a ground node 108 and differential input node 118. The drain terminal of transistor 142 is coupled to a differential output node 112, which is a signal output ($V_{OUT}$) of amplifier 100.

PMOS load circuit 182 is coupled between the NMOS differential input circuit 180 and a power supply node 102 ($V_{DD}$) and includes approximately matched PMOS load transistors 144 and 146. The source terminals of transistors 144 and 146 are coupled to power supply node 102. The gate terminals of transistors 144 and 146 are coupled to another power supply node 105 ($V_{BB2}$) to receive a bias voltage. The drain terminal of transistor 144 is coupled to the drain terminal of transistor 140 at another differential output node 116. The drain terminal of transistor 146 is coupled to the drain terminal of transistor 142 at differential output node 112.

Current source circuit 184 includes a NMOS current source transistor 148 coupled between source node 120 and ground node 108. The gate terminal of transistor 148 is coupled to power supply node 104 ($V_{BB1}$) to receive a bias voltage. The drain terminal of transistor 148 is coupled to source node 120. The source terminal of transistor 148 is coupled to ground node 108.

Figure 1B:
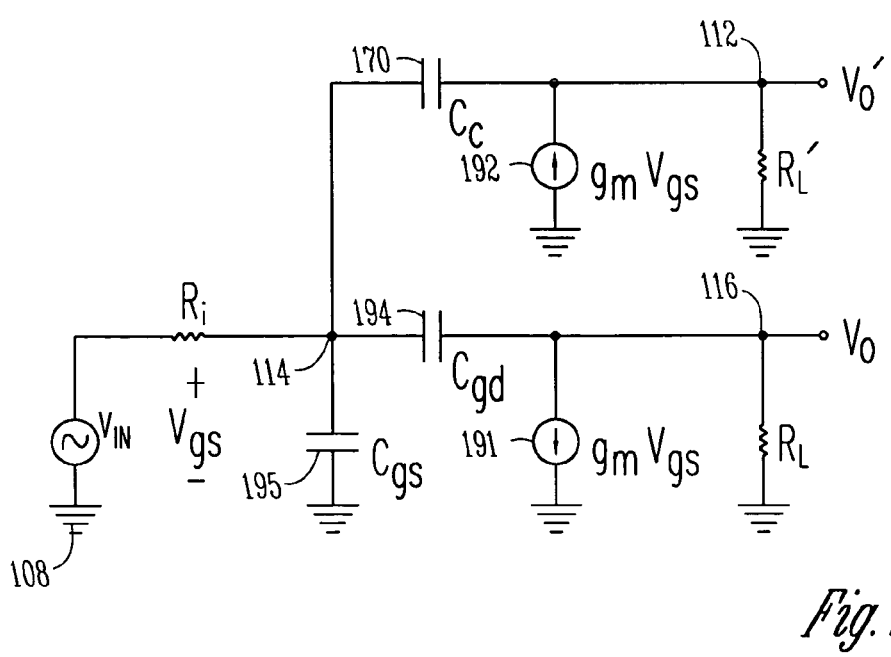
FIG. 1B is a schematic showing the small-signal equivalent of portions of the CMOS fully differential amplifier of FIG. 1A.

Frequency compensation circuit 185 provides amplifier 100 with positive feedback frequency compensation and includes compensating capacitors 170 and 172. To illustrate how each compensating capacitor functions, FIG. 1B is presented, with a small-signal equivalent of portions of amplifier 100. Because amplifier 100 is a symmetrical differential amplifier, source node 120 is a virtual ground. The circuit analysis is performed using a simplified model including a single input amplifier representing the left-hand side of the symmetrical circuit of amplifier 100. In FIG. 1B, the small-signal equivalent of transistor 140 includes a gate-to-source capacitance 195 ($C_{gs}$), a gate-to-drain capacitance 194 ($C_{gd}$), and a current source 191. An input signal is applied to differential input node 114 by a voltage source $V_i$ through an input resistance $R_i$. $R_L$ represents the equivalent load at differential output node 116. $R_L'$ represents the equivalent load at differential output node 112. $V_o$ represents the output signal at differential output node 116. $V_o'$ represents the output signal at differential output node 112. A current source 192 represents the transconductance and gain of transistor 142, which provides the current following to differential input node 114 through compensating capacitor 170 and $R_L'$. Transistors 140 and 142 each have a small signal gain of $g_m$, so the current amplitude provided by each of current source 191 and 192 are $g_m V_{gs}$, where $V_{gs}$ is the AC gate-to-source voltage.

Without compensating capacitor 170, $C_{gd}$ is amplified and then reflected to differential input node 114. This is known as the Miller effect. The resultant input capacitance of transistor 140 is then $C_{gs}+C_{gd}(1+g_m R_L)$. With compensating capacitor 170, current from current source 192 is injected into the gate terminal of transistor 140. Compensating capacitor 170 is selected for a capacitance $C_c$ that matches $C_{gd}$. Because $V_o$ and $V_o'$ are approximately equal in amplitude but 180 degrees out of phase, and $C_c$ approximately equals $C_{gd}$, the currents flowing through $C_{gd}$ substantially cancel each other. That is, the net current flow through $C_{gd}$ approaches zero. Thus, the effect of $C_{gd}$ in the input capacitance of transistor 140, i.e., the Miller effect, is substantially reduced or eliminated. The input capacitance of transistor 140 is approximately $C_{gs}$. In the same manner, compensating capacitor 172 substantially reduces or eliminates the Miller effect in the input capacitance of transistor 142.

Now referring back to FIG. 1A, the Miller effect in amplifier 100 exists as the gate-to-drain capacitance of each of transistors 140 and 142 is multiplied by the gain of the amplifier and reflected to the gate terminal. To compensate for the Miller effect, compensating capacitor 170 is coupled between the drain terminal of transistor 142 (differential output node 112) and the gate terminal of transistor 140 (differential input node 114). This results in additional current being injected into the gate terminal of transistor 140 through compensating capacitor 170. Compensating capacitor 170 is chosen for a capacitance that approximately matches the gate-to-drain capacitance of transistor 140. Because the signals at the drain terminals of transistors 140 and 142 (i.e., differential output nodes 116 and 112) are about equal in amplitude but 180 degrees out of phase, the signal current (supplied by $V_{IN}$) flowing through the gate-to-drain capacitance of transistor 140 approaches zero. Compensating capacitor 172 is coupled between the drain terminal of transistor 140 (differential output node 116) and the gate terminal of transistor 142 (differential input node 118). This results in additional current being injected into the gate terminal of transistor 142 through compensating capacitor 172. Compensating capacitor 172 is chosen for a capacitance that approximately matches the gate-to-drain capacitance of transistor 142 (which also approximately matches the gate-to-drain capacitance of transistor 141 because transistors 141 and 142 are approximately matched NMOS transistors). Because the signals at the drain terminals of transistors 140 and 142 (i.e., differential output nodes 116 and 112) are about equal in amplitude but 180 degrees out of phase, the signal current flowing through the gate-to-drain capacitance of transistor 142 approaches zero. Thus, the effect of the gate-to-drain capacitance, i.e., the Miller effect, is substantially eliminated or minimized. The frequency and time response of amplifier 100 is determined primarily by the gate-to-source capacitance of each of transistors 140 and 142. Frequency compensation circuit 185 provides amplifier 100 with a substantially increased frequency response and a substantially faster time response, with a modest decrease in phase margin, when compared to a CMOS fully differential amplifier with the same circuit configuration but without the frequency compensation circuit.

FIG. 2 is a schematic illustrating a CMOS current mirror differential amplifier 200. In practice, fully differential CMOS amplifiers such as amplifier 100 are difficult to implement because of the requirement for near-perfectly matched transistors. The difficulty is avoided by using a current mirror current as the load circuit. Amplifier 200 differs from amplifier 100 in that amplifier 200 employs a current mirror circuit to load the NMOS input transistors of the differential input circuit. Amplifier 200 includes an NMOS differential input circuit 280, a PMOS current mirror circuit 282, a current source circuit 284, and the frequency compensation circuit 285.

NMOS differential input circuit 280 includes approximately matched NMOS input transistors 240 and 242 coupled as a differential pair. The gate terminal of NMOS transistor 240 is coupled to a differential input node 214. The gate terminal of transistor 242 is coupled to another differential input node 218. The source terminals of transistors 240 and 242 are coupled to a source node 220. The loads of transistors 240 and 242 are obtained from the PMOS load circuit 282 through the drain terminals of transistors 240 and 242. An input resistor 260 is coupled between a signal input 210 ($V_{IN}$) and differential input node 214. Another input resistor 262 is coupled between a ground node 208 and differential input node 218. The drain terminal of transistor 242 is coupled to a differential output node 212, which is a signal output ($V_{OUT}$) of amplifier 200.

PMOS current mirror circuit 282 is coupled between the NMOS differential input circuit 280 and a power supply node 202 ($V_{DD}$) and includes PMOS load transistors 244 and 246. Transistor 244 is connected to operate as a low impedance diode with an anode being the source terminal of transistor 244 and a cathode being the drain and gate terminals of transistor 244 connected together. The anode is coupled to power supply node 202. The cathode is coupled to the drain terminal of transistor 240 and the gate terminal of transistor 246 at another differential output node 216. The source terminal of transistor 246 is coupled to power supply node 202. The drain terminal of transistor 246 is coupled to the drain terminal of transistor 242 at differential output node 212.

Current source circuit 284 includes an NMOS current source transistor 248 coupled between source node 220 and ground node 208. The gate terminal of transistor 248 is coupled to power supply node 204 ($V_{BB}$) to receive a bias voltage. The drain terminal of transistor 248 is coupled to source node 220. The source terminal of transistor 248 is coupled to ground node 208.

Frequency compensation circuit 285 provides amplifier 200 with positive feedback frequency compensation and includes compensating capacitors 270 and 272. Miller effect in amplifier 200 exists as the gate-to-drain capacitance of each of transistors 240 and 242 is multiplied by the gain of the amplifier and reflected to the gate terminal. To compensate for the Miller effect, compensating capacitor 270 is coupled between the drain terminal of transistor 242 (differential output node 212) and the gate terminal of transistor 240 (differential input node 214), and compensating capacitor 272 is coupled between the drain terminal of transistor 240 (differential output node 216) and the gate terminal of transistor 242 (differential input node 218). Compensating capacitors 270 and 272 are chosen for a capacitance that is approximately equal to the gate-to-drain capacitance of transistors 240 and 242 (which are approximately matched transistors having approximately equal gate-to-drain capacitances). For the same reason as discussed above for amplifier 100, frequency compensation circuit 285 substantially eliminates or minimizes the signal current flowing through the gate-to-drain capacitance of each of transistors 240 and 242, thus substantially eliminating or minimizing the effect of the gate-to-drain capacitances on the frequency and time response of amplifier 200, i.e., the Miller effect. The frequency and time response of amplifier 200 is determined primarily by the gate-to-source capacitance of each of transistors 240 and 242. Frequency compensation circuit 285 provides amplifier 200 with a substantially increased frequency response and a substantially faster time response, with a modest decrease in phase margin, when compared to a CMOS fully differential amplifier with the same circuit configuration but without the frequency compensation circuit.

FIGS. 3–7 are schematics illustrating various embodiments of CMOS current mirror differential amplifiers as variations of amplifier 200. The CMOS current mirror differential amplifiers in these embodiments each include a basic amplifier circuit similar to amplifier 200 as illustrated in FIG. 2 and a positive feedback frequency compensation circuit including one or more compensating capacitors. Each capacitor is coupled between a gate terminal of an input transistor and a differential output node with a driving signal. The driving signal creates a current that is injected into the gate terminal of the input transistor such that the net current following through the gate-to-drain capacitance of the input transistor is substantially eliminated or minimized. In each of these embodiments, the frequency compensation circuit provides the CMOS current mirror amplifier with a substantially increased frequency response and a substantially faster time response when compared to the CMOS current mirror differential amplifier with the same circuit configuration but without the frequency compensation circuit.

FIG. 3 is a schematic illustrating another CMOS current mirror differential amplifier 300. Amplifier 300 includes an NMOS differential input circuit 380, a PMOS current mirror circuit 382, a bias resistor 364, and a frequency compensation circuit 385.

NMOS differential input circuit 380 includes approximately matched NMOS input transistors 340 and 342 coupled as the differential pair. The gate terminal of transistor 340 is coupled to a differential input node 314. An input resistor 360 is coupled between a signal input 310 ($V_{IN}$) and differential input node 314. The gate terminal of transistor 342 is coupled to a ground node 308. The source terminals of transistors 340 and 342 are coupled to a source node 320. Bias resistor 364 is coupled between source node 320 and a power supply node 306 ($V_{SS}$). PMOS current mirror circuit 382 includes a PMOS load transistor 344 connected as a diode and another PMOS transistor 346. The source terminals of transistors 344 and 346 are coupled to another power supply node 302 ($V_{DD}$). The gate and drain terminals of transistor 344 and the gate terminal of transistor 346 are coupled to the drain terminal of transistor 340 at a differential output node 316. The drain terminal of transistor 346 is coupled to the drain terminal of transistor 342 at another differential output node 312, which is a signal output ($V_{OUT}$) of amplifier 300. Frequency compensation circuit 385 includes a single compensating capacitor 370 coupled between the drain terminal of transistor 342 (differential output node 312) and the gate terminal of transistor 340 (differential input node 314). Compensating capacitor 370, which is chosen for a capacitance that is approximately equal to the gate-to-drain capacitance of transistor 340, compensates for the effect of the gate-to-drain capacitance of transistor 340 in the same manner as discussed above for compensating capacitor 170 or 270. Because the gain at differential output node 316 is one, there is no large output signal swing at differential output node 316 to drive a second compensating capacitor if coupled between the drain terminal of transistor 340 (differential output node 316) and the gate terminal of transistor 342. Thus, no compensating capacitor is used to compensate for the effect of the gate-to-drain capacitance of transistor 342.

Figure 4:
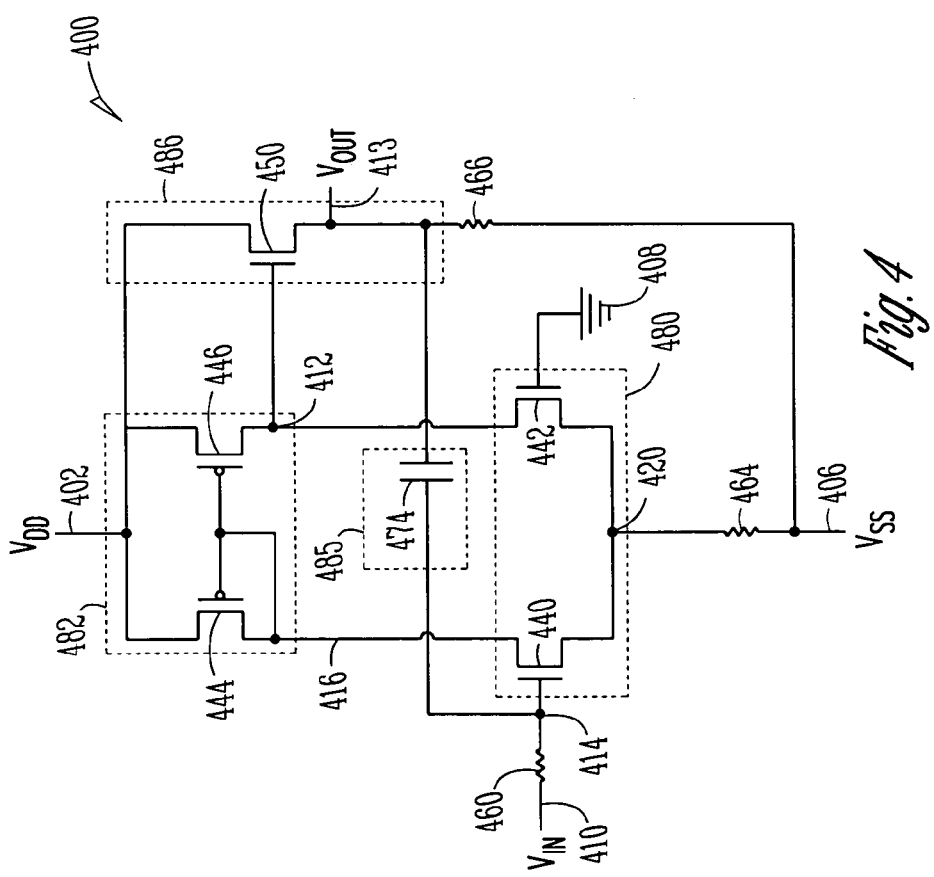
FIG. 4 is a schematic illustrating an embodiment of another CMOS current mirror differential amplifier with a frequency compensation circuit.

FIG. 4 is a schematic illustrating another CMOS current mirror differential amplifier 400. Amplifier 400 is a modified version of amplifier 300 and includes a first stage circuit including an NMOS differential input circuit 480, a PMOS current mirror circuit 482, and a bias resistor 464, an output stage circuit 486, and a frequency compensation circuit 485. Amplifier 400 has a frequency response that is similar to that of amplifier 300.

NMOS differential input circuit 480 includes approximately matched NMOS input transistors 440 and 442 coupled as a differential pair. The gate terminal of transistor 440 is coupled to a differential input node 414. An input resistor 460 is coupled between a signal input 410 ($V_{IN}$) and differential input node 414. The gate terminal of transistor 442 is coupled to a ground node 408. The source terminals of transistors 440 and 442 are coupled to a source node 420. Bias resistor 464 is coupled between source node 420 and a power supply node 406 ($V_{SS}$). PMOS current mirror circuit 482 includes a PMOS load transistor 444 connected as a diode and another PMOS transistor 446. The source terminals of transistors 444 and 446 are coupled to another power supply node 402 ($V_{DD}$). The gate and drain terminals of transistor 444 and the gate terminal of transistor 446 are coupled to the drain terminal of transistor 440 at a differential output node 416. The drain terminal of transistor 446 is coupled to the drain terminal of transistor 442 at another differential output node 412. Output stage circuit 486 is a source follower circuit that includes an NMOS output transistor 450 and a resistor 466. The gate terminal of transistor 450 is coupled to differential output node 412 to receive the output of the first stage circuit. The drain of transistor 450 is coupled to power supply node 402 ($V_{DD}$). The source terminal of transistor 450 is coupled to resistor 466 at node 413, which is a signal output ($V_{OUT}$). Resistor 466 is coupled between node 413 and another power source node 406 ($V_{SS}$). Frequency compensation circuit 485 includes a single compensating capacitor 474 coupled between the source terminal of transistor 450 (node 413, i.e. $V_{OUT}$) and the gate terminal of transistor 440 (differential input node 414). Compensating capacitor 474 is chosen for a capacitance that is approximately equal to the gate-to-drain capacitance of transistor 440. The output signal swing at node 413 is about the same as the output signal swing at differential output node 412. Therefore, compensating capacitor 474 compensates for the effect of the gate-to-drain capacitance of transistor 440 in the same manner as discussed above for compensating capacitor 370, while it does not load the output of the first stage circuit at differential output node 412.

Figure 5:
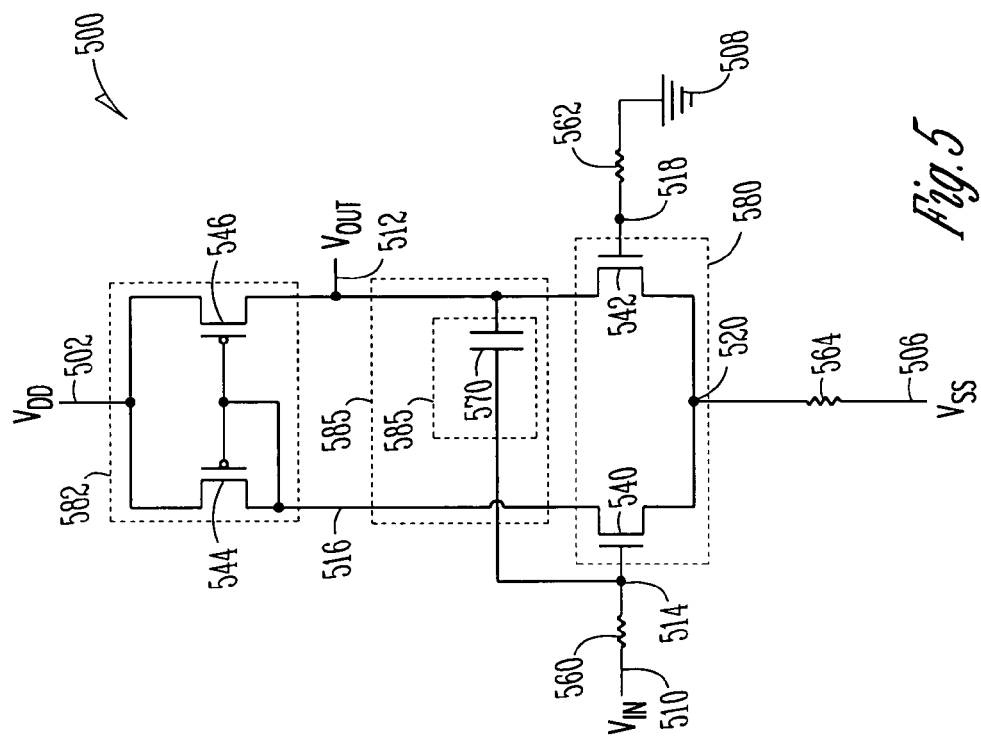
FIG. 5 is a schematic illustrating another CMOS current mirror differential amplifier with a frequency compensation circuit.

FIG. 5 is a schematic illustrating another CMOS current mirror differential amplifier 500. Amplifier 500 includes an NMOS differential input circuit 580, a PMOS current mirror circuit 582, a bias resistor 564, and a frequency compensation circuit 585.

NMOS differential input circuit 580 includes approximately matched NMOS input transistors 540 and 542 coupled as the differential pair. The gate terminal of transistor 540 is coupled to a differential input node 514. An input resistor 560 is coupled between a signal input 510 ($V_{IN}$) and differential input node 514. The gate terminal of transistor 542 is coupled to another input resistor 562 at another differential input node 518. Input resistor 562 is then coupled to a ground node 508. The source terminals of transistors 540 and 542 are coupled to a source node 520. Bias resistor 564 is coupled between source node 520 and a power supply node 506 ($V_{SS}$). PMOS current mirror circuit 582 includes a PMOS load transistor 544 connected as a diode and another PMOS transistor 546. The source terminals of transistors 544 and 546 are coupled to another power supply node 502 ($V_{DD}$). The gate and drain terminals of transistor 544 and the gate terminal of transistor 546 are coupled to the drain terminal of transistor 540 at a differential output node 516. The drain terminal of transistor 546 is coupled to the drain terminal of transistor 542 at another differential output node 512, which is a signal output ($V_{OUT}$). Frequency compensation circuit 585 includes a single compensating capacitor 570 coupled between the drain terminal of transistor 542 (differential output node 512) and the gate terminal of transistor 540 (differential input node 514). Compensating capacitor 570, which is chosen for a capacitance that is approximately equal to the gate-to-drain capacitance of transistor 540, compensates for the effect of the gate-to-drain capacitance of transistor 540 in the same manner as discussed above for compensating capacitor 170 or 270. Because the gain at differential output node 516 is one, there is no large output signal swing at differential output node 516 to drive a second compensating capacitor if coupled between the drain terminal of transistor 540 (differential output node 516) and the gate terminal of transistor 542 (differential input node 518). Thus, no compensating capacitor is used to compensate for the effect of the gate-to-drain capacitance of transistor 542.

Figure 6:
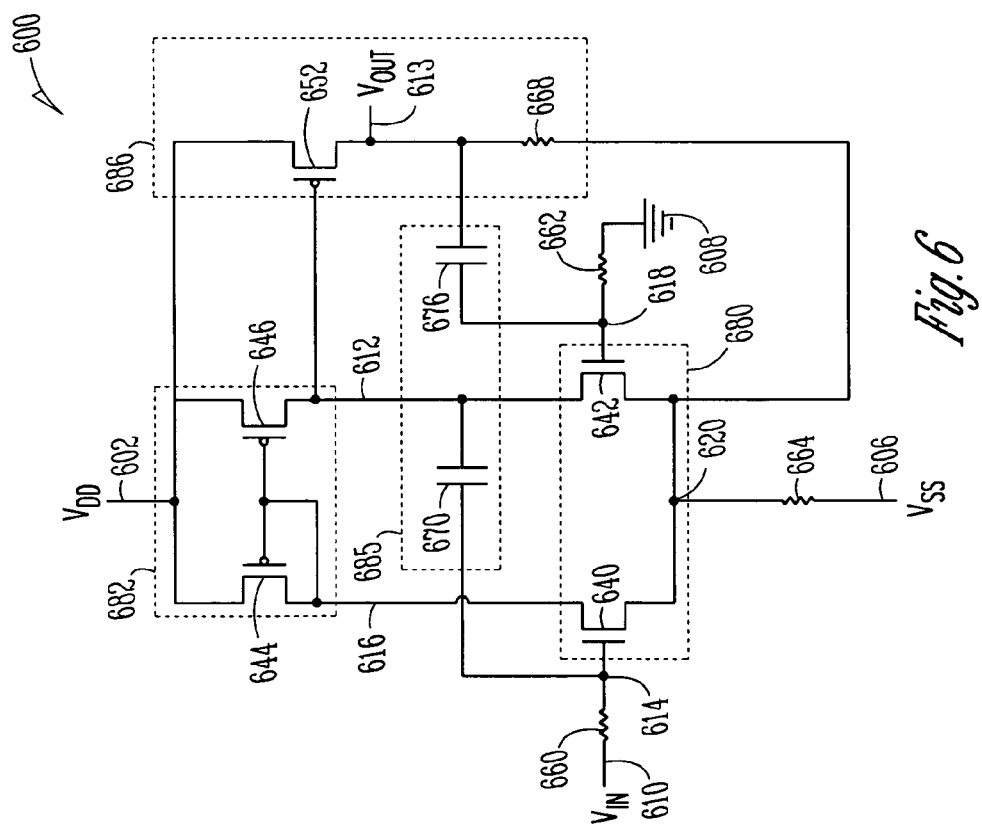
FIG. 6 is a schematic illustrating an embodiment of another CMOS current mirror differential amplifier with a frequency compensation circuit.

FIG. 6 is a schematic illustrating another CMOS current mirror differential amplifier 600. Amplifier 600 is a modified version of amplifier 500 and includes a first stage circuit including an NMOS differential input circuit 680, a PMOS current mirror circuit 682, and a bias resistor 664, an output stage circuit 686, and a frequency compensation circuit 685. Amplifier 600 has an increased frequency response when compared to amplifier 500.

NMOS differential input circuit 680 includes approximately matched NMOS input transistors 640 and 642 coupled as the differential pair. The gate terminal of transistor 640 is coupled to a differential input node 614. An input resistor 660 is coupled between a signal input 610 ($V_{IN}$) and differential input node 614. The gate terminal of transistor 642 is coupled to another input resistor 662 at another differential input node 618. Input resistor 662 is then coupled to a ground node 608. The source terminals of transistors 640 and 642 are coupled to a source node 620. Bias resistor 664 is coupled between source node 620 and a power supply node 606 ($V_{SS}$). PMOS current mirror circuit 682 includes a PMOS load transistor 644 connected as a diode and another PMOS transistor 646. The source terminals of transistors 644 and 646 are coupled to a power supply node 602 ($V_{DD}$). The gate and drain terminals of transistor 644 and the gate terminal of transistor 646 are coupled to the drain terminal of transistor 640 at a differential output node 616. The drain terminal of transistor 646 is coupled to the drain terminal of transistor 642 at another differential output node 612. Output stage circuit 686 is an amplifier circuit that includes a PMOS output transistor 652 and a resistor 668. The gate terminal of transistor 652 is coupled to differential output node 612 to receive the output of the first stage circuit. The source terminal of transistor 652 is coupled to power supply node 602 ($V_{DD}$). The drain terminal of transistor 652 is coupled to resistor 668 at node 613, which is a signal output ($V_{OUT}$). Resistor 668 is coupled between node 613 and source node 620. Frequency compensation circuit 685 includes compensating capacitors 670 and 676. Compensating capacitor 670 is coupled between the drain terminal of transistor 642 (differential output node 612) and the gate terminal of transistor 640 (differential input node 614). Compensating capacitor 676 is coupled between the drain terminal of transistor 652 (node 613, i.e., $V_{OUT}$) and the gate terminal of transistor 642 (differential input node 618). Compensating capacitor 670 compensates for the effect of the gate-to-drain capacitance of transistor 640 in the same manner as discussed above for compensating capacitor 570. The output signal swing at differential output node 612 is inverted at node 613, thus providing a driving signal for compensating capacitor 676. The driving signals for compensating capacitors 670 and 676 are about equal in amplitude and near 180 degrees out of phase. Compensating capacitor 676 compensates for the effect of the gate-to-drain capacitance of transistor 642 by minimizing the net current follow through the gate-to-drain capacitance of transistor 642. Compensating capacitors 670 is chosen for a capacitance that is approximately equal to the gate-to-drain capacitance of transistor 640. Compensating capacitor 676 is feeding charge from node 613 to node 618, across the first stage and the output stage circuits. Because output stage circuit 686 is an amplifier circuit having a gain, compensating capacitor 676 is chosen for a capacitance that is approximately equal to the gate-to-drain capacitance of transistor 642 divided by the gain of output stage circuit 686. In one embodiment, output stage circuit 686 is configured for a gain of one, and compensating capacitors 676 is chosen for a capacitance that is approximately equal to the gate-to-drain capacitance of transistor 642. In one embodiment, transistors 640 and 642 are approximately matched transistors having approximately matched gate-to-drain capacitances, and output stage circuit 686 is configured for a gain of one. In this embodiment, compensating capacitors 670 and 676 are chosen for the same capacitance that is approximately equal to the gate-to-drain capacitance of transistors 640 and 642. Amplifier 600 has better frequency and time responses amplifier 500 because the Miller effect associated with both NMOS input transistors of the differential input circuit is compensated.

Figure 7:
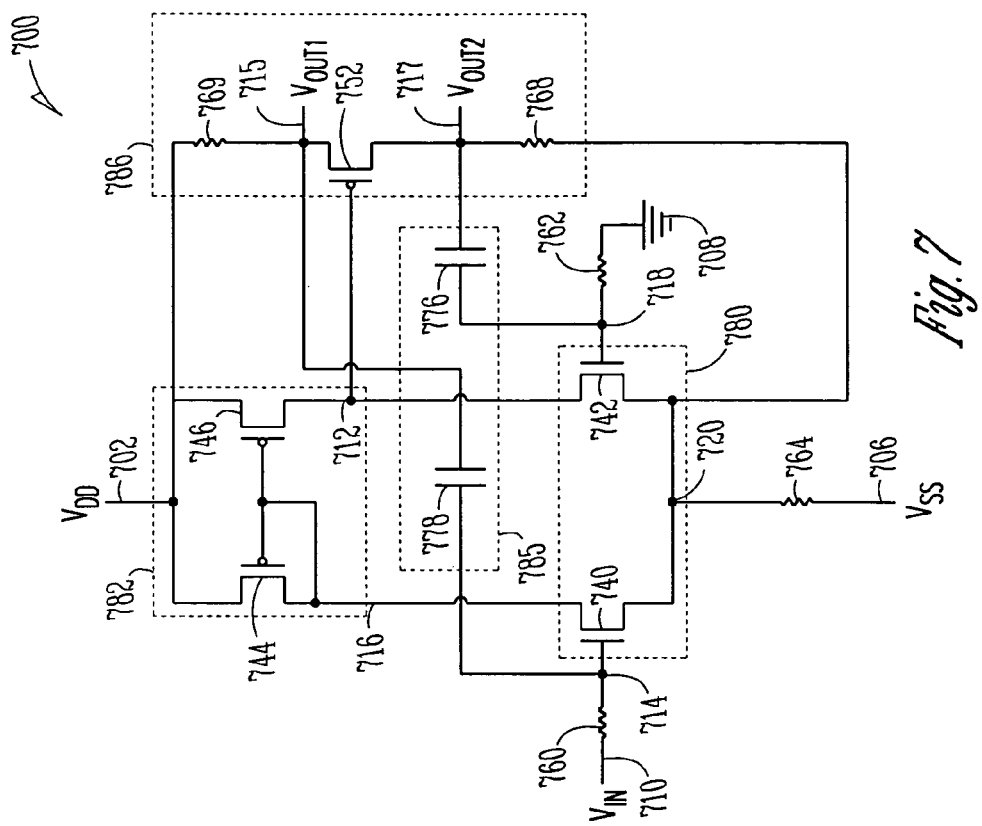
FIG. 7 is a schematic illustrating an embodiment of another CMOS current mirror differential amplifier with a frequency compensation circuit.

FIG. 7 is a schematic illustrating another CMOS current mirror differential amplifier 700. Amplifier 700 is another modified version of amplifier 500 and includes a first stage circuit including an NMOS differential input circuit 780, a PMOS current mirror circuit 782, and a bias resistor 764, an output stage circuit 786, and a frequency compensation circuit 785. Amplifier 700 has a frequency response that is broader than that of amplifier 500.

NMOS differential input circuit 780 includes approximately matched NMOS input transistors 740 and 742 coupled as the differential pair. The gate terminal of transistor 740 is coupled to a differential input node 714. An input resistor 760 is coupled between a signal input 710 ($V_{IN}$) and a differential input node 714. The gate terminal of transistor 742 is coupled to another input resistor 762 at another differential input node 718. Input resistor 762 is then coupled to a ground node 708. The source terminals of transistors 740 and 742 are coupled to a source node 720. Bias resistor 764 is coupled between source node 720 and a power supply node 706 ($V_{SS}$). PMOS current mirror circuit 782 includes a PMOS load transistor 744 connected as a diode and another PMOS transistor 746. The source terminals of transistors 744 and 746 are coupled to another power supply node 702 ($V_{DD}$). The gate and drain terminals of transistor 744 and the gate terminal of transistor 746 are coupled to the drain terminal of transistor 740 at a differential output node 716. The drain terminal of transistor 746 is coupled to the drain terminal of transistor 742 at another differential output node 712. Output stage circuit 786 is an amplifier and follower circuit that includes a PMOS output transistor 752 and resistors 768 and 769. The gate terminal of transistor 752 is coupled to differential output node 712 to receive the output of the first stage circuit. The source terminal of transistor 752 is coupled to resistor 769 at node 715, which is a signal output ($V_{OUT1}$). Resistor 769 is coupled between node 715 and power supply node 702 ($V_{DD}$). The drain terminal of transistor 752 is coupled to resistor 768 at node 717, which is another signal output ($V_{OUT2}$). Resistor 768 is coupled between node 717 and source node 720. Frequency compensation circuit 785 includes compensating capacitors 778 and 776. Compensating capacitor 778 is coupled between the source terminal of transistor 752 (node 715, i.e., $V_{OUT1}$) and the gate terminal of transistor 740 (differential input node 714). Compensating capacitor 776 is coupled between the drain terminal of transistor 752 (node 717, i.e., $V_{OUT2}$) and the gate terminal of transistor 742 (differential input node 718). Compensating capacitors 778 and 776 are chosen for a capacitance that is approximately equal to the gate-to-drain capacitance of transistors 740 and 742 (which are approximately matched transistors having approximately equal gate-to-drain capacitances). The two signal outputs, $V_{OUT1}$ and $V_{OUT2}$, provide output signals that are about equal in amplitude and about 180 degrees out of phase, thus providing large driving signals for compensating capacitors 778 and 776. As a result, compensating capacitor 778 compensates for the effect of the gate-to-drain capacitance of transistor 740 by minimizing the net current follow through the gate-to-drain capacitance of transistor 740, and compensating capacitor 776 compensates for the effect of the gate-to-drain capacitance of transistor 742 by minimizing the net current follow through the gate-to-drain capacitance of transistor 742. When compared to amplifier 600, the driving signals for the compensating capacitors in amplifier 700 are closer to 180 degrees out of phase, thus providing even better frequency compensation.

FIG. 8 includes graphs showing simulation results illustrating the effects of frequency compensation circuit 285 on the frequency response of CMOS current mirror differential amplifier circuit 200. Curve 800 is the gain of amplifier 200 without frequency compensation circuit 285. Curve 810 the gain of amplifier 200 with frequency compensation circuit 285. A comparison between curve 800 and curve 810 shows that frequency compensation circuit 285 substantially increases the frequency response of amplifier 200.

Figure 9:
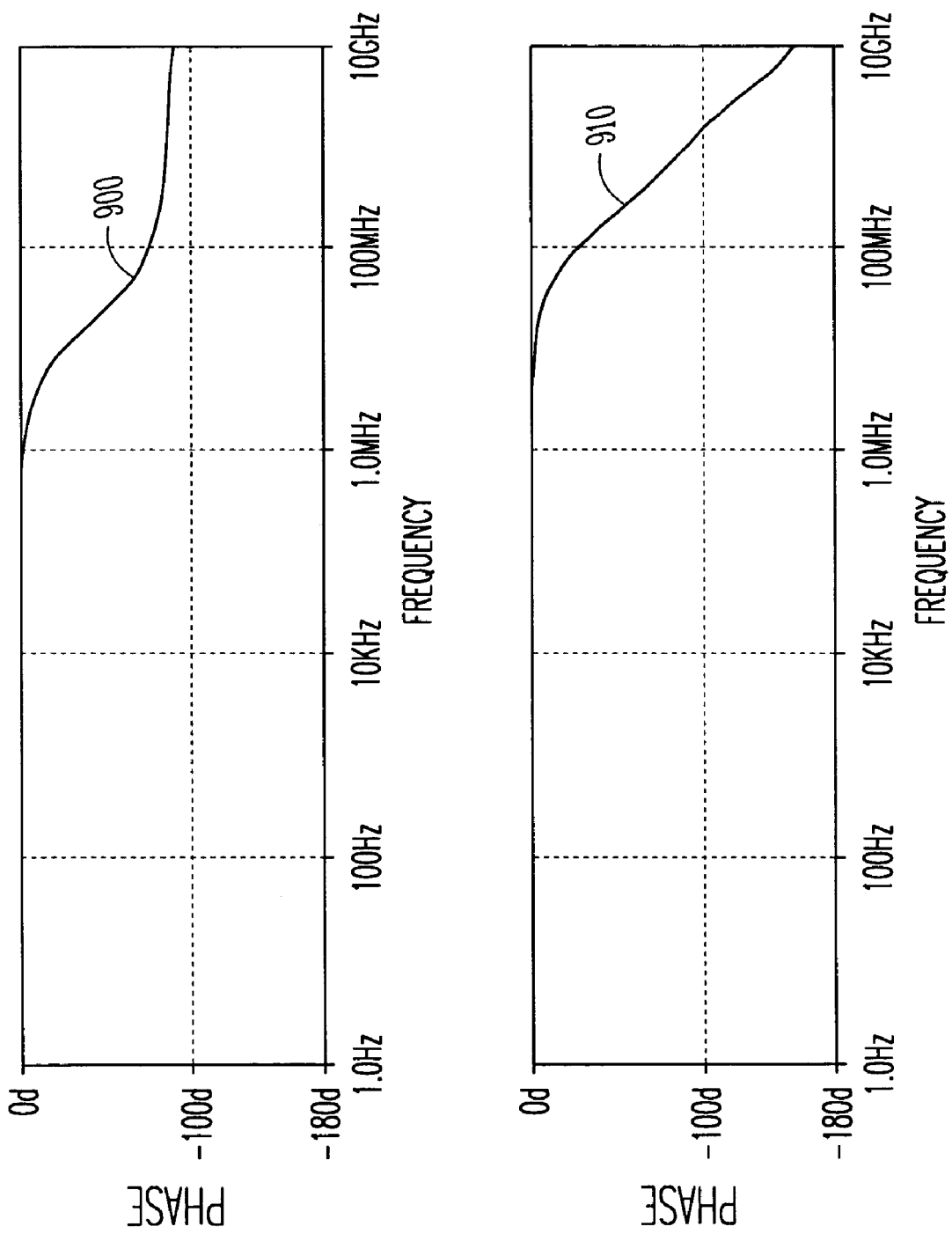
FIG. 9 includes additional graphs showing simulation results illustrating the effects of the frequency compensation circuit on the frequency response of the CMOS current mirror differential amplifier circuit of FIG. 2.

FIG. 9 includes additional graphs showing simulation results illustrating the effects of frequency compensation circuit 285 on the frequency response of amplifier 200. Curve 900 is the phase response of amplifier 200 without frequency compensation circuit 285. Curve 910 is the phase response of amplifier 200 with frequency compensation circuit 285. A comparison between curve 900 and curve 910 shows that while substantially increasing the frequency response of amplifier 200, frequency compensation circuit 285 only modestly decreases the phase margin of amplifier 200.

FIG. 10 includes graphs showing simulation results illustrating the effect of frequency compensation circuit 285 on the transient response of amplifier 200. The graph including curves 1000, 1002, and 1004 shows the transient response of amplifier 200 without frequency compensation circuit 285. Curve 1000 is the voltage at node 210 ($V_{IN}$); curve 1002 is the voltage at differential input node 214; and curve 1004 is the voltage at differential output node 212 ($V_{OUT}$). The graph including curves 1010, 1012, and 1014 shows the transient response of amplifier 200 with frequency compensation circuit 285. Curve 1010 is the voltage at node 210 ($V_{IN}$); curve 1012 is the voltage at differential input node 214; and curve 1014 is the voltage at differential output node 212 ($V_{OUT}$). A comparison between curve 1004 and curve 1014 shows that frequency compensation circuit 285 substantially increases the speed of amplifier 200.

Figure 11:
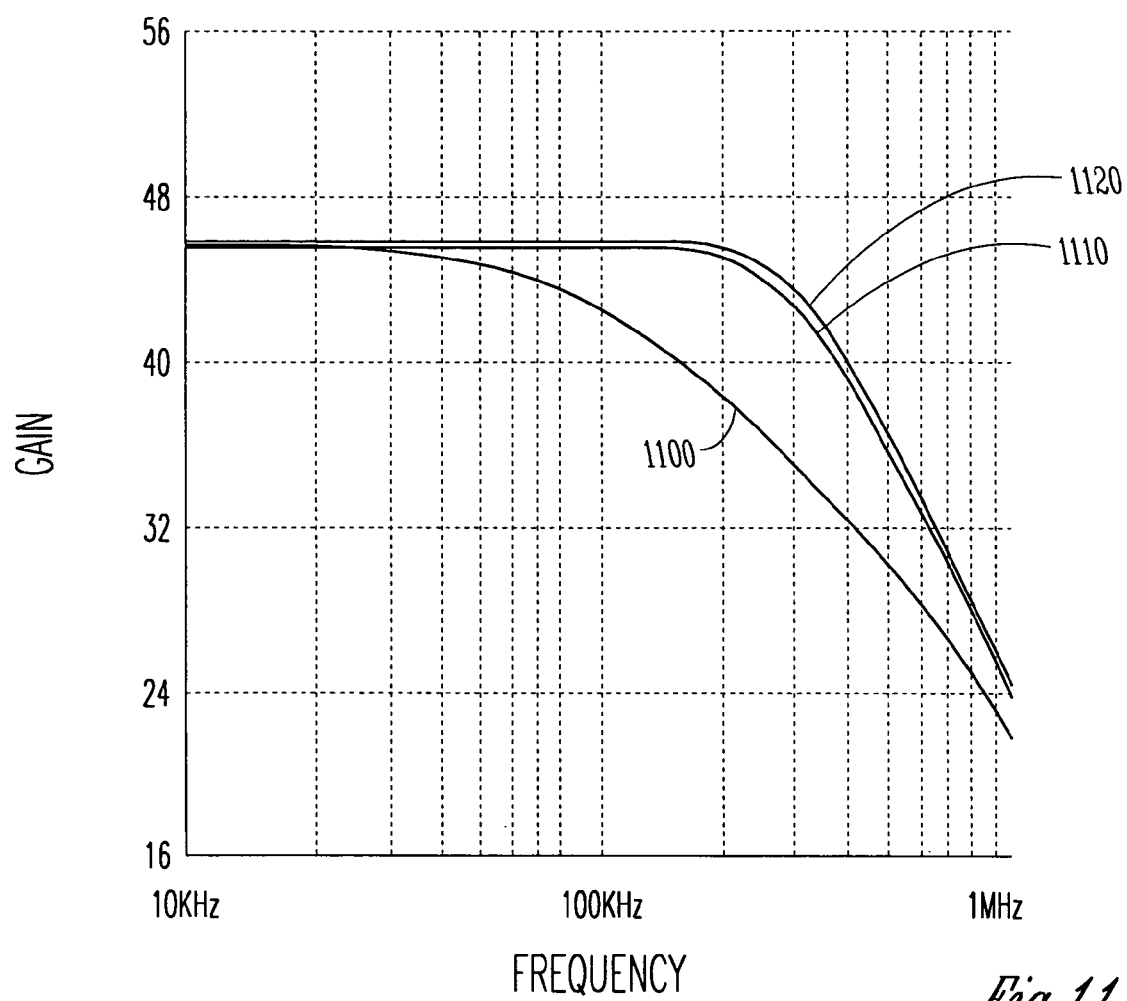
FIG. 11 is a graph showing simulation results illustrating the frequency responses of the CMOS current mirror differential amplifier circuits of FIGS. 3 and 4.

FIG. 11 is a graph showing simulation results illustrating the frequency responses of the CMOS current mirror differential amplifier circuits 300 and 400. Curve 1100 is the gain of amplifier 300 without frequency compensating circuit 385 (i.e., without compensating capacitor 370). Curve 1110 is the gain of amplifier 300 with frequency compensating circuit 385 (i.e., with compensating capacitor 370). Curve 1120 is the gain of amplifier 400. A comparison between curve 1100 and curve 1110 shows that frequency compensation circuit 385 substantially increases the frequency response of amplifier 300. A comparison between curve 1110 and curve 1120 shows that output stage circuit 486 (source follower circuit) has minimal effect on the frequency response of amplifier 400 while avoiding the loading of the differential input circuit by the compensating capacitor.

Figure 12:
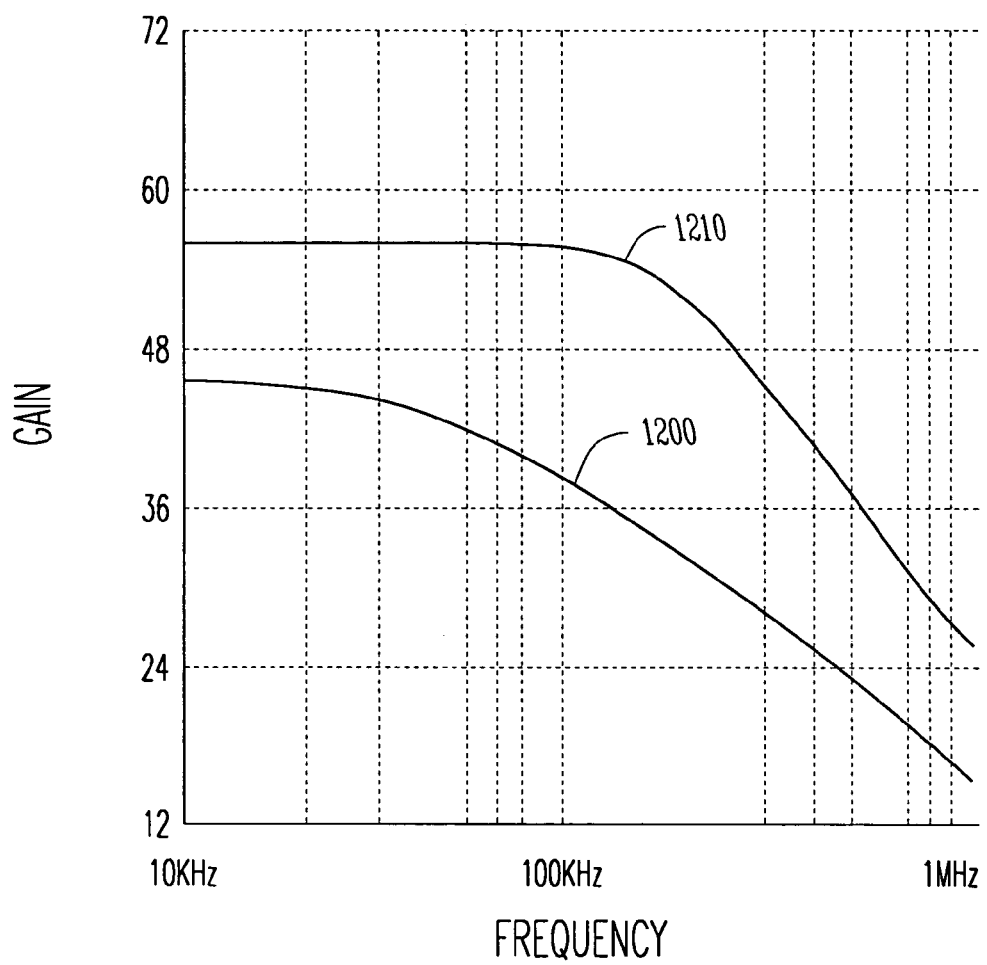
FIG. 12 is a graph showing simulation results illustrating the frequency responses of the CMOS current mirror differential amplifier circuits of FIGS. 5 and 6.

FIG. 12 is a graph showing simulation results illustrating the frequency responses of the CMOS current mirror differential amplifier circuits 500 and 600. Curve 1200 is the gain of amplifier 500. Curve 1210 is the gain of amplifier 600. A comparison between curve 1200 and curve 1210 shows the further frequency compensation achieved in amplifier 600 by compensating for the Miller effect associated with both input transistors as compared with compensating for the Miller effect associated with one input transistor as in amplifier 500.

Figure 13:
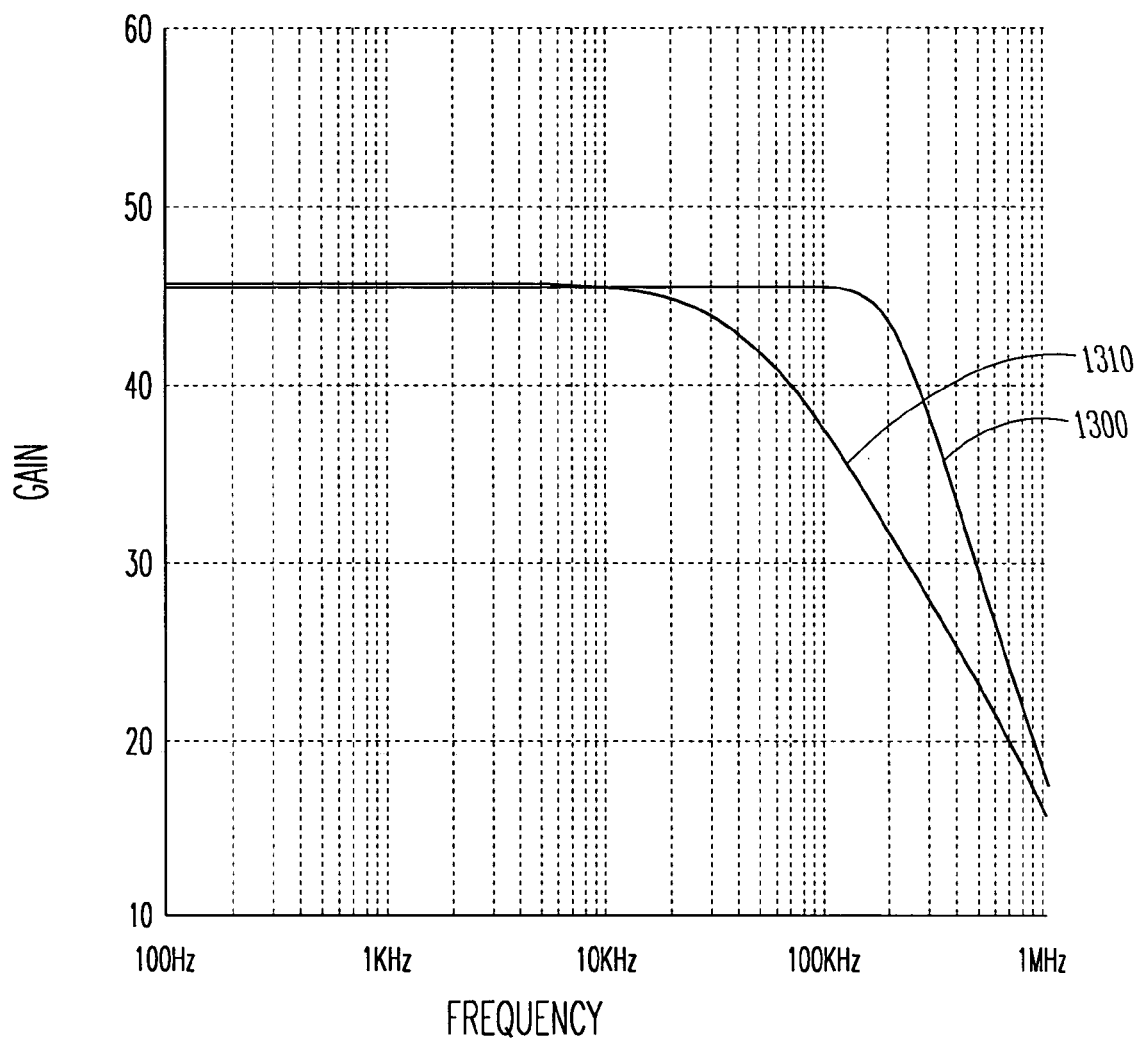
FIG. 13 is a graph showing simulation results illustrating the frequency responses of the CMOS current mirror differential amplifier circuits of FIGS. 5 and 7.

FIG. 13 is a graph showing simulation results illustrating the frequency responses of the CMOS current mirror differential amplifier circuits 500 and 700. Curve 1300 is the gain of amplifier 500. Curve 1310 is the gain of amplifier 700. A comparison between curve 1300 and curve 1310 shows the further frequency compensation achieved in amplifier 700 by compensating for the Miller effect associated with both input transistors as compared with compensating for the Miller effect associated with one input transistor as in amplifier 500. Amplifier 700 has potentially better frequency compensation than amplifier 600 because the driving signals for the compensating capacitors are closer to 180 degrees out of phase in amplifier 700.

Figure 14:
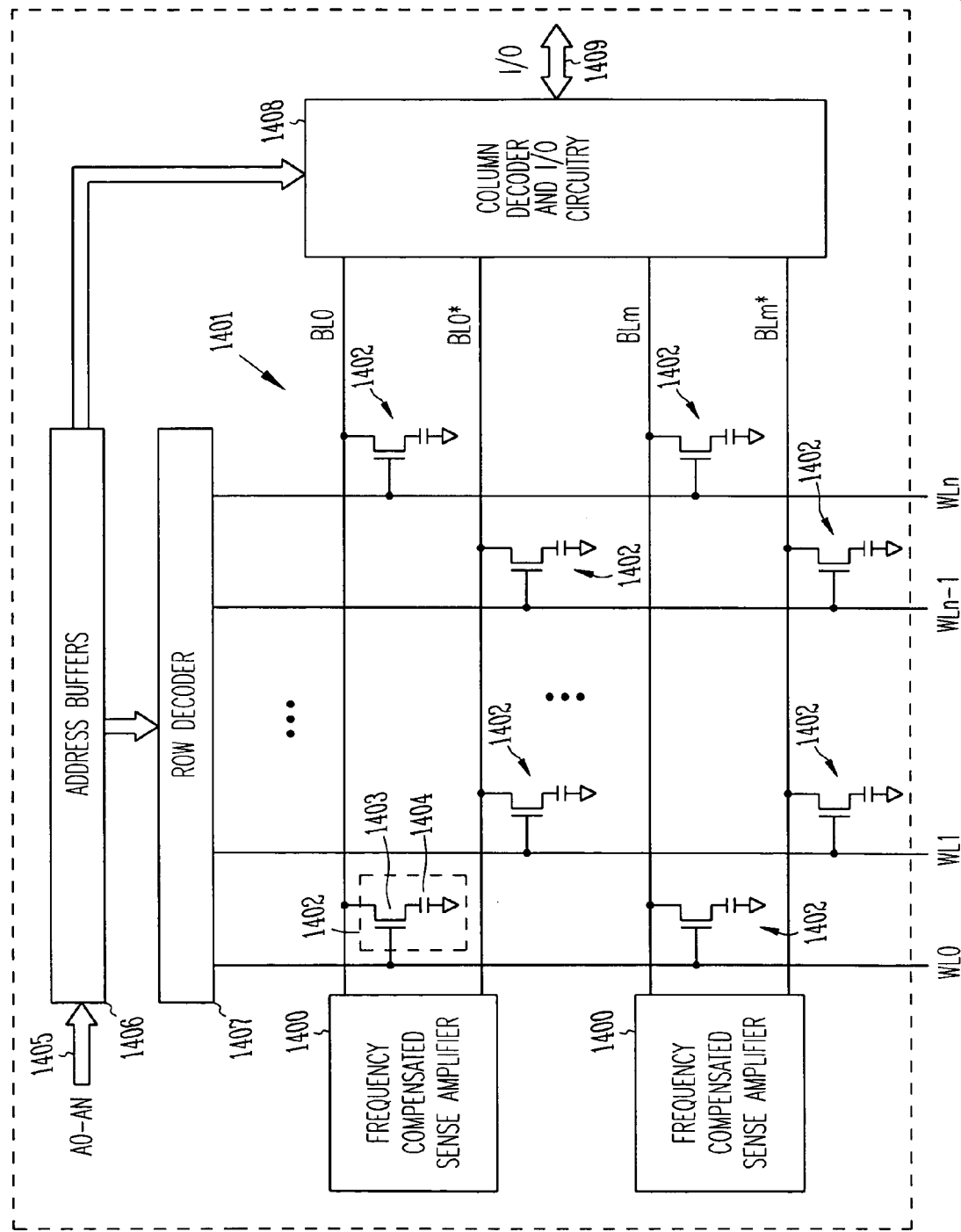
FIG. 14 is a block diagram illustrating one embodiment of a memory circuit using CMOS differential amplifiers as sense amplifiers.

The CMOS amplifiers discussed above include, but not limited to, operational amplifiers (e.g., amplifiers 100, 200, 300, and 500) and memory sense amplifiers (e.g., amplifiers 400, 600, and 700). FIG. 14 is a block diagram illustrating one embodiment of a memory circuit that uses one of the CMOS differential amplifier circuit configurations discussed above in its sense amplifiers. In an exemplary embodiment, the memory circuit is a DRAM circuit. However, the CMOS differential amplifier circuit configurations can be incorporated into other semiconductor memory devices including, but not being limited to, static random access memory devices, synchronous random access memory devices or other types of memory devices that include a matrix of memory cells that are selected or addressed by selectively activation of row and column conductors. The memory circuit includes a memory array 1401 including rows and columns of memory cells 1402. As illustrated in FIG. 14, memory array 1401 has m rows and n columns, with pairs of complementary bit lines BL0/BL0*–BLm/BLm* and word (address) lines WL0–WLn. Each of memory cell 1402 is identified by one unique combination of a bit line BL (selected from BL0–BLm) or BL* (selected from BL0*–BLm*) and a word line WL (selected from WL0–WLn).

Complementary bit line pairs BL0/BL0*–BLm/BLm* are used for writing data into and reading data from memory cells 1402. Word lines WL0–WLn are address lines used for selecting the memory cells to which data are written into and from which the data are read from. Address buffers 1406 receive address signals A0–An from address lines 1405 connected to an external controller, such as a microprocessor coupled to the memory circuit. In response, address buffers 1406 control row decoders 1407 and column decoder and input/output circuitry 1408 to access memory cells 1402 selected according to address signals A0–An. Data provided at data input/outputs 1409 are written into memory array 1401. Data read from memory array 1401 are applied to data input/outputs 1409. Memory cells 1402 each include a switch 1403 and a storage capacitor 1404. In one embodiment, switch 1403 includes an n-channel field effect transistor, such as an NMOS transistor. The n-channel transistor has a drain terminal coupled to a BL (selected from BL0–BLm) or a BL* (selected from BL0*–BLm*), a source terminal coupled to storage capacitor 1404, and a gate terminal coupled to a WL (selected from WL0–WLn).

To write or read data, address buffers 1406 receive an address identifying a column of memory cells and select one of the word lines WL0–WLn according to the address. Row decoder 1407 activates the selected word line to activate switch 1403 of each cell connected to the selected word line. Column decoder and input/output circuitry 1408 selects the particular memory cell for each data bit according to the address. To write data, each date bit at data input/outputs 1409 causes storage capacitor 1404 of one of the selected cells to be charged, or to stay discharged, to represent the data bit. To read data, a data bit stored in each of the selected cells, as represented by the charge state of storage capacitor 1404 of the selected cell, is transferred to data input/outputs 1409.

Frequency compensated sense amplifiers 1400 are each coupled between a complementary bit line pair, BL and BL*. Storage capacitor 1404 in each of memory cells 1402 has a small capacitance and holds a data bit for a limited time as the capacitor discharges. Frequency compensated sense amplifiers 1400 are used to "refresh" memory cells 1402 by detecting and amplifying signals each representing a stored data bit. The amplified signals recharge the storage capacitors and hence maintain the data in memory cells 1402. In one specific embodiment, each of frequency compensated sense amplifiers 1400 includes the basic configuration of one of amplifiers 100, 200, 300, or 500, with one differential input node coupled to BL and the other differential input node coupled to BL*.

The present subject matter is generally applicable to other CMOS amplifiers having basic configurations similar to amplifiers 100, 200, 300, 400, 500, 600, or 700. The specific circuits and sub-circuits discussed above are examples that illustrate, but not restrict, the present subject matter. For example, sub-circuits (such as the differential input circuit, the current mirror circuit, the current source circuit, and the output stage circuit) with various alternative configurations as known in the art can be used to substitute for one or more sub-circuits of the CMOS amplifiers discussed above, in various embodiments of the present subject matter.

In general, this document discusses, among other things, improvement of frequency and transient responses of a CMOS differential amplifier by employing one or more compensating capacitors. A compensating capacitor coupled to a differential input of the CMOS differential amplifier is used to inject current into the differential input, such that the net current flow through the gate-to-drain capacitance of a MOS input transistor approaches zero. Thus, the Miller effect with respect to that MOS input transistor is substantially reduced or eliminated, resulting in increased frequency and transient responses for the CMOS differential amplifier.

In one embodiment, a frequency-compensated CMOS amplifier circuit is provided. The CMOS amplifier circuit includes a differential input circuit, a load circuit coupled to the differential input circuit, a signal output coupled to the differential input circuit, and a compensating capacitor. The differential input circuit includes first and second differential input nodes and first and second MOS input transistors. The gate terminal of the first MOS input transistor is coupled to the first differential input node. The gate terminal of the second MOS input transistor coupled to the second differential input node. The compensating capacitor is coupled between the signal output and one of the first and second differential input nodes.

In one embodiment, a frequency compensation method for a CMOS amplifier is provided. The CMOS amplifier includes differentially coupled first and second MOS input transistors. The gate-to-drain capacitance of the first MOS input transistor is identified. A compensating capacitor having a capacitance approximately equal to that gate-to-drain capacitance is selected. One terminal of the compensating capacitor is coupled to the gate terminal of one of the first MOS input transistor. A driving signal is applied to the other terminal of the compensating capacitor. The driving signal and the output signal at the drain terminal of the first MOS transistor are approximately equal in amplitude and approximately 180 degrees out of phase.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A CMOS amplifier circuit, comprising:
   a differential input circuit including:
      a differential input node; and
      differentially coupled first NMOS input transistor having first gate, drain, and source terminals and second NMOS input transistor having second gate, drain, and source terminals, the first gate terminal coupled to the differential input node;
   a first voltage reference node;
   a current mirror circuit including a third PMOS load transistor having third gate, drain, and source terminals and a fourth PMOS load transistor having fourth gate, drain, and source terminals, the third and fourth gate terminals coupled to the first and third drain terminals, the fourth drain terminal coupled to the second drain terminal, the third and fourth source terminals coupled to the first voltage reference node;
   a follower circuit including a fifth NMOS output resistor having fifth gate, drain, and source terminals, the fifth gate terminal coupled to the second and fourth drain terminals; and
   a compensating capacitor coupled between the fifth source terminal and the differential input node.

2. The CMOS amplifier circuit of claim 1, wherein the first NMOS input transistor has a first gate-to-drain capacitance, and wherein the compensating capacitor has a capacitance approximately equal to the first gate-to-drain capacitance.

3. A method for making a CMOS amplifier, the method comprising:
   providing a differential input circuit including differentially coupled first and second NMOS input transistors each having gate, drain, and source terminals;
   connecting a current mirror circuit between the differential input circuit and a power supply source;
   connecting an output stage circuit to the differential input circuit, the output stage circuit including at least one signal output; and
   connecting a first compensating capacitor between the gate terminal of the first NMOS input transistor and the at least one signal output.

4. The method of claim 3, wherein connecting the output stage circuit to the differential input circuit comprises connecting a follower circuit to the differential input circuit, the follower circuit including a NMOS output transistor having gate, drain, and source terminals.

5. The method of claim 4, wherein connecting the follower circuit to the differential input circuit comprises connecting the gate terminal of the NMOS output transistor to the drain terminal of the second NMOS input transistor, and wherein connecting the first compensating capacitor comprises connecting the compensating capacitor between the gate terminal of the first NMOS input transistor and the source terminal of the NMOS output transistor.

6. The method of claim 3, wherein connecting the output stage circuit to the differential input circuit comprises connecting an amplifier and source follower circuit to the differential input circuit, the source follower including a PMOS output transistor having gate, drain, and source terminals.

7. The method of claim 6, wherein connecting the amplifier and source follower circuit to the differential input circuit comprises connecting the gate terminal of the PMOS output transistor to the drain terminal of the second NMOS input transistor, wherein connecting the first compensating capacitor comprises connecting the compensating capacitor between the gate terminal of the first NMOS input transistor and the source terminal of the PMOS output transistor, and further comprising connecting a second compensating capacitor between the gate terminal of the second NMOS input transistor and the drain terminal of the PMOS output transistor.

* * * * *